(12) United States Patent
Grondahl

(10) Patent No.: US 8,183,929 B2
(45) Date of Patent: May 22, 2012

(54) MULTI-CHIP DOHERTY AMPLIFIER WITH INTEGRATED POWER DETECTION

(75) Inventor: Christopher D. Grondahl, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 58 days.

(21) Appl. No.: 12/757,803

(22) Filed: Apr. 9, 2010

(65) Prior Publication Data

US 2011/0248784 A1    Oct. 13, 2011

(51) Int. Cl.
*H03F 3/68* (2006.01)
(52) U.S. Cl. ..................... 330/295; 330/124 R
(58) Field of Classification Search ............. 330/53, 330/84, 124 R, 134, 136, 286, 295
See application file for complete search history.

(56) References Cited

U.S. PATENT DOCUMENTS

| | | | |
|---|---|---|---|
| 5,757,229 A * | 5/1998 | Mitzlaff | 330/124 R |
| 7,786,797 B2 * | 8/2010 | Okazaki et al. | 330/295 |
| 2004/0174212 A1 * | 9/2004 | Kim et al. | 330/124 R |

* cited by examiner

*Primary Examiner* — Khanh Nguyen
(74) *Attorney, Agent, or Firm* — Snell & Wilmer LLP

(57) ABSTRACT

In accordance with an exemplary embodiment of the present invention, a Doherty amplifier is provided for applications in radio frequency, microwave, and other electronic systems. An exemplary Doherty amplifier comprises a first MMIC having a first power detector, and a second MMIC having a second power detector. The first MMIC and the second MMIC are structurally identical. Furthermore, the first MMIC is configured as a carrier amplifier and the second MMIC is configured as a peaking amplifier. In the exemplary embodiment, an amplifier control bias of the carrier amplifier is a function of the power detected by the first power detector and an amplifier control bias of the peaking amplifier is a function of the power detected by the second power detector. The ability to assemble a Doherty amplifier using a single MMIC product results in a simple and less expensive manufacturing process.

20 Claims, 5 Drawing Sheets

MULTI-CHIP DOHERTY AMPLIFIER WITH INTEGRATED POWER DETECTION

FIELD OF THE INVENTION

The present invention relates generally to electronic amplifiers, and more specifically to employing multi-chip Doherty amplifiers with integrated power detection to control amplifier biasing.

BACKGROUND OF THE INVENTION

In electronics, there is an ongoing need to improve the efficiency and bandwidth of amplifier circuits. One method for improving the efficiency of an amplifier was invented in 1934 by William H. Doherty. A typical Doherty amplifier is shown in FIG. 1 and has a class-AB main amplifying stage 110 in parallel with a class-C auxiliary amplifier stage 120. The Doherty amplifier receives an input signal from an off-chip source that controls the biasing provided to the amplifier stages using a biasing control circuit. An input signal is split evenly to drive the two amplifiers, and a combining network 102 sums output signals from the main and auxiliary stages and corrects for phase differences between them. During periods of lower signal power levels, the main stage efficiently amplifies the input signal and the auxiliary stage remains off. In this mode, the main amplifier dynamic load impedance is about two times higher than the optimum power match. During higher power signal peaks, main stage 110 approaches compression but remains operating while auxiliary stage 120 also turns on and transforms the dynamic load of both amplifiers to their optimum power match. This increases the overall efficiency dynamic range (which is the input power range over which efficiency remains high) by about 6 dB.

In a typical Doherty amplifier assembly, the class-AB main amplifying stage 110 and the class-C auxiliary amplifier stage 120 are manufactured on integrated circuits having different operating parameters. In a prior art embodiment, an off-chip power detector and bias control circuit 130 is used to provide bias for the class-AB main amplifier 110 and the class-C auxiliary amplifier 120. The same input biasing voltage is provided to each biasing control circuit. In turn, the individual integrated circuits are designed to produce the desired amplification of the various amplification stages 110, 120 using this common biasing voltage. However, the use of an off-chip detector and control solution adds complexity to the design. Thus, a need exists for a Doherty amplifier design that utilizes the same integrated power detection and bias control circuits in both the main amplifying stage and the auxiliary amplifier stage. Furthermore, a need exists for the main amplifier and the auxiliary amplifier to be created using the same MMIC design.

SUMMARY OF THE INVENTION

In accordance with an exemplary embodiment of the present invention, a Doherty amplifier is provided for applications in radio frequency (RF), microwave, and other electronic systems. In an exemplary embodiment, a Doherty amplifier comprises a first MMIC having a first power detector, and a second MMIC having a second power detector. The first MMIC and the second MMIC are structurally identical. Furthermore, the first MMIC is configured as a carrier amplifier and the second MMIC is configured as a peaking amplifier. In the exemplary embodiment, an amplifier control bias of the carrier amplifier is a function of the power detected by the first power detector and an amplifier control bias of the peaking amplifier is a function of the power detected by the second power detector. In accordance with the exemplary embodiment, an integrated power detection bias control circuit is adaptable to provide bias for a class-AB main amplifier or a class-C auxiliary amplifier. The ability to assemble a Doherty amplifier using a single MMIC product results in a simple and less expensive manufacturing process. Furthermore, using the same MMIC design for both the class-AB main amplifier and the class-C auxiliary amplifier saves design cost and production cost.

Furthermore, an exemplary N-way multichip Doherty amplifier has N physically identical separate parallel amplifier paths, where each path has an amplifier MMIC, an RF power detector, a splitter connected to each MMIC to provide input signals and a combiner connected to the outputs of each MMIC. An exemplary method of controlling the Doherty amplifier includes detecting, with a first RF power detector, the power in an RF input signal in a first amplifier path of a first amplifier MMIC, providing a signal representing the detected power to an amplifier MMIC gate bias control of the first amplifier MMIC, and biasing the first amplifier MMIC based on at least the detected power provided to the amplifier MMIC gate bias control. The exemplary method also includes detecting, with a second RF power detector, the power in the RF input signal in a second amplifier path of a second amplifier MMIC, providing a signal representing the detected power to an amplifier MMIC gate bias control of the second amplifier MMIC, and biasing the second amplifier MMIC based on at least the detected power provided to the amplifier MMIC gate bias control.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. In the drawings, like reference numerals designate like parts throughout the different views, wherein:

DETAILED DESCRIPTION OF THE INVENTION

Figure 1:
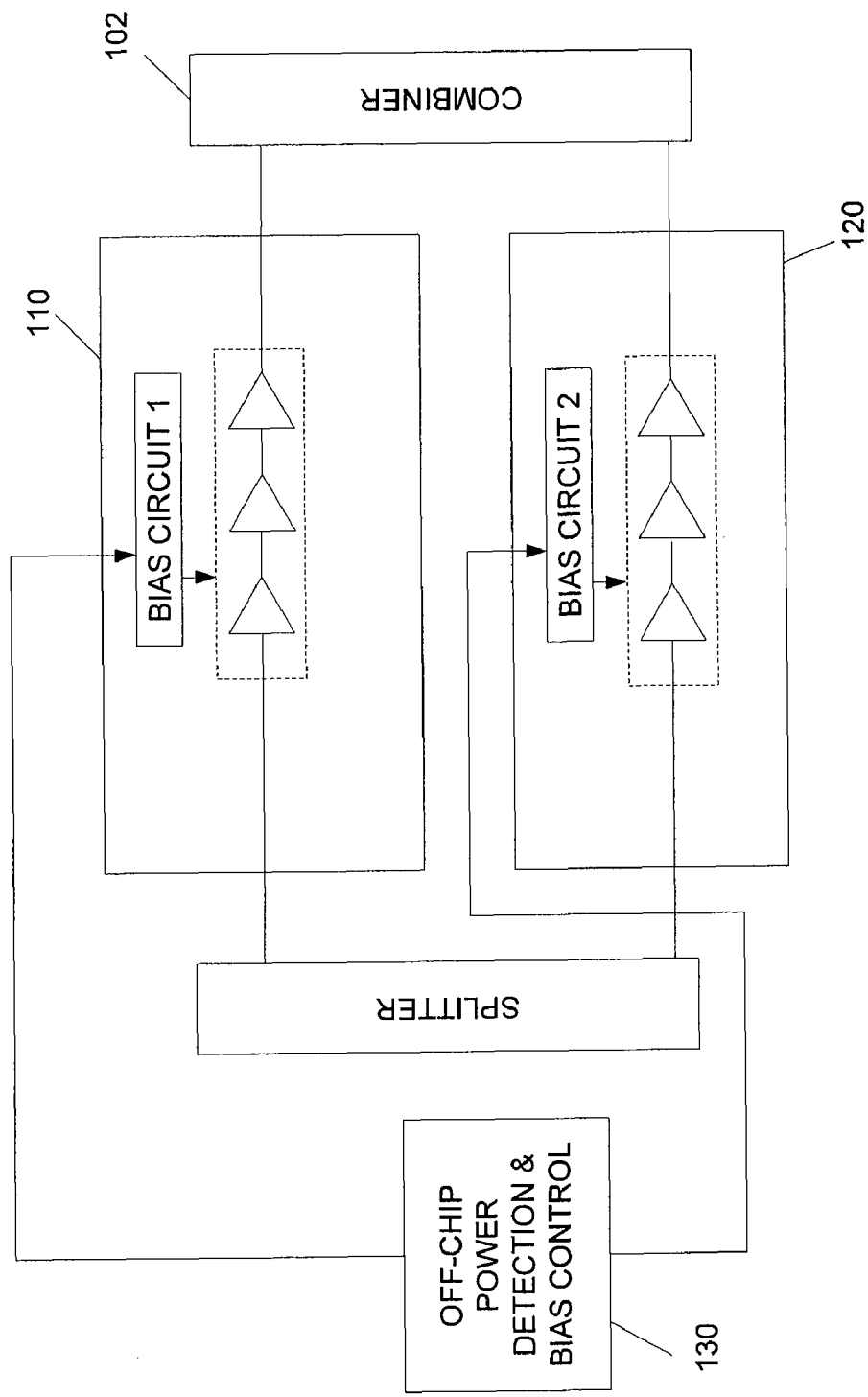
FIG. 1 is a schematic representation of a conventional Doherty amplifier.

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

A typical Doherty amplifier includes multiple amplifier paths. The basic configuration has only two paths, a peaking amplifier path and a carrier amplifier path. In accordance with an exemplary embodiment and with reference to FIG. 2, a multi-chip Doherty amplifier 200 comprises a peaking amplifier MMIC 210 and a carrier amplifier MMIC 220. MMIC 210 and MMIC 220 each receive an input signal from an off-chip 90° splitter 201. Each MMIC 210, 220 also transmits an output signal to an off-chip Doherty combining network 202. Furthermore, in an exemplary embodiment, peaking amplifier MMIC 210 comprises at least one amplifier 211, an amplifier bias control circuit 212, and a power detector 213. Similarly, in an exemplary embodiment, carrier amplifier MMIC 220 comprises at least one amplifier 221, an amplifier bias control circuit 222, and a power detector 223.

Figure 2:
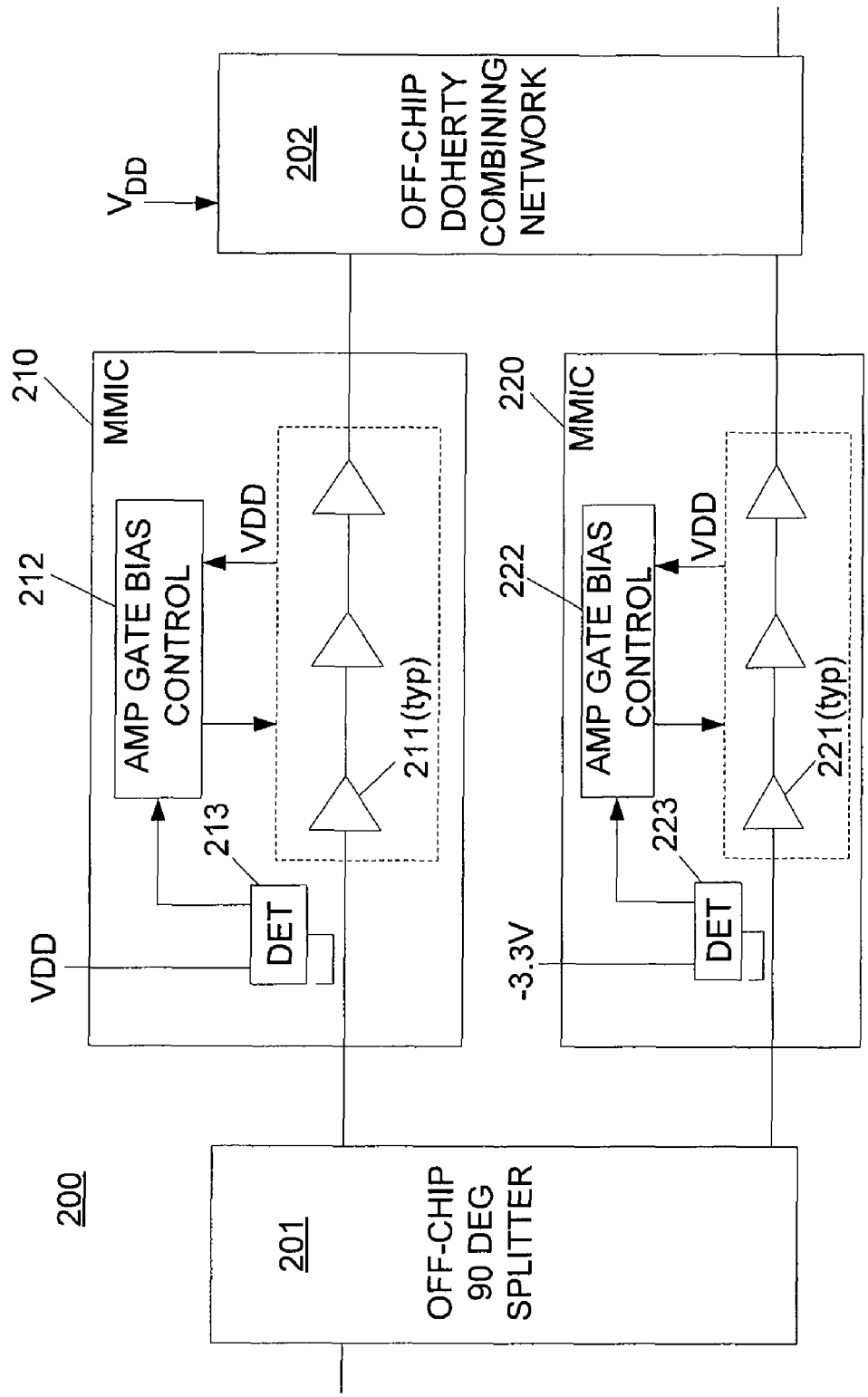
FIG. 2 is a block diagram of one exemplary embodiment of a multi-chip Doherty amplifier in accordance with an exemplary embodiment of the invention.

In an exemplary embodiment, amplifier bias control circuits 212, 222 generate a desired "amplifier bias versus RF power" function. The amplifier bias control circuits 212, 222 are configured to individually receive a signal (referred to as an input) from power detectors 213, 223, respectively. For example, the input may be a DC input. The input controls the amount of bias current supplied by amplifier bias control circuits 212, 222 to the at least one amplifiers 211, 221. In an exemplary embodiment, the bias voltage is supplied to the gate of the amplifiers and controls the amplification levels. Furthermore, in an exemplary embodiment, the bias current of carrier amplifier MMIC 220 remains substantially constant with RF input power. In another exemplary embodiment, the bias current of peaking amplifier MMIC 210 increases with RF input power. In addition, amplifier bias control circuits 212, 222 are powered from an outside source. The outside source is separate from the input provided by power detectors 213, 223. For example, FIG. 2 shows amplifier bias control circuits 212, 222 being powered by VDD, though any other suitable input power may be used.

In accordance with an exemplary embodiment, the bias of amplifier bias control circuits 212, 222 are a function of the RF input power. The RF input power may be detected by an RF power detector, for example, power detectors 213, 223. In an exemplary embodiment, the RF power detector is integrated on each of said MMICs 210, 220. In another exemplary embodiment, the RF power detector is located off-chip and sends an amplifier bias control signal to the corresponding MMIC. In accordance with an exemplary embodiment, the RF power detector generates the amplifier bias control signal based on the level of power drawn through the corresponding MMIC. The amplifier bias control signal is used to bias amplifier bias control circuits 212, 222. Furthermore, the amplifier bias control signal is influenced by the biasing of the RF power detector, which controls the sensitivity of the power detector.

In an exemplary embodiment, one or more adaptive RF power detectors is configured to provide different bias functions to each amplifier path in an N-way multi-chip Doherty amplifier, where identical MMICs are used in the Doherty amplifier. Accordingly, in an exemplary embodiment, power detectors 213, 223 are adaptive by individually biasing the power detectors at different voltages. As such, power detector 213 may have different biasing than power detector 223.

In an exemplary embodiment, the bias of the power detector is set according to the specific amplifier path. The DC output of the power detector is then fed to the bias control circuit of the Doherty amplifier, and used to generate a desired "amplifier bias vs. RF power" function. The "amplifier bias vs. RF input" function desired for carrier amplifier MMIC 220 can be realized by making power detector 223 on carrier amplifier MMIC 220 insensitive to RF input power. Biasing the power detector at a negative voltage (reverse-biasing) results in decreased sensitivity to the RF power, or results in the power detector not responding to a range of RF input power. Thus, in an exemplary embodiment, power detector 223 on MMIC 220 is reverse-biased. For example, power detector 223 may be reverse-biased at −3.3 volts. In another example, power detector 223 may be reverse-biased at a voltage in the range of −1 to −5 volts. Furthermore, power detector 223 may be reverse-biased at any suitable negative voltage.

The "amplifier bias vs. RF input" function desired for peaking amplifier MMIC 210 can be realized by making power detector 213 on peaking amplifier MMIC 210 sensitive to RF input power. Biasing the power detector at a positive voltage (forward-biasing) results in increased sensitivity to the RF power. Thus, in an exemplary embodiment, power detector 213 on MMIC 210 is forward biased. For example, one power detector may be forward-biased at 0.5 volts. In another example, power detector 213 may be forward-biased at a voltage in the range of 0.1 to 5 volts. Furthermore, power detector 223 may be forward-biased at any suitable positive voltage.

Figure 3A:
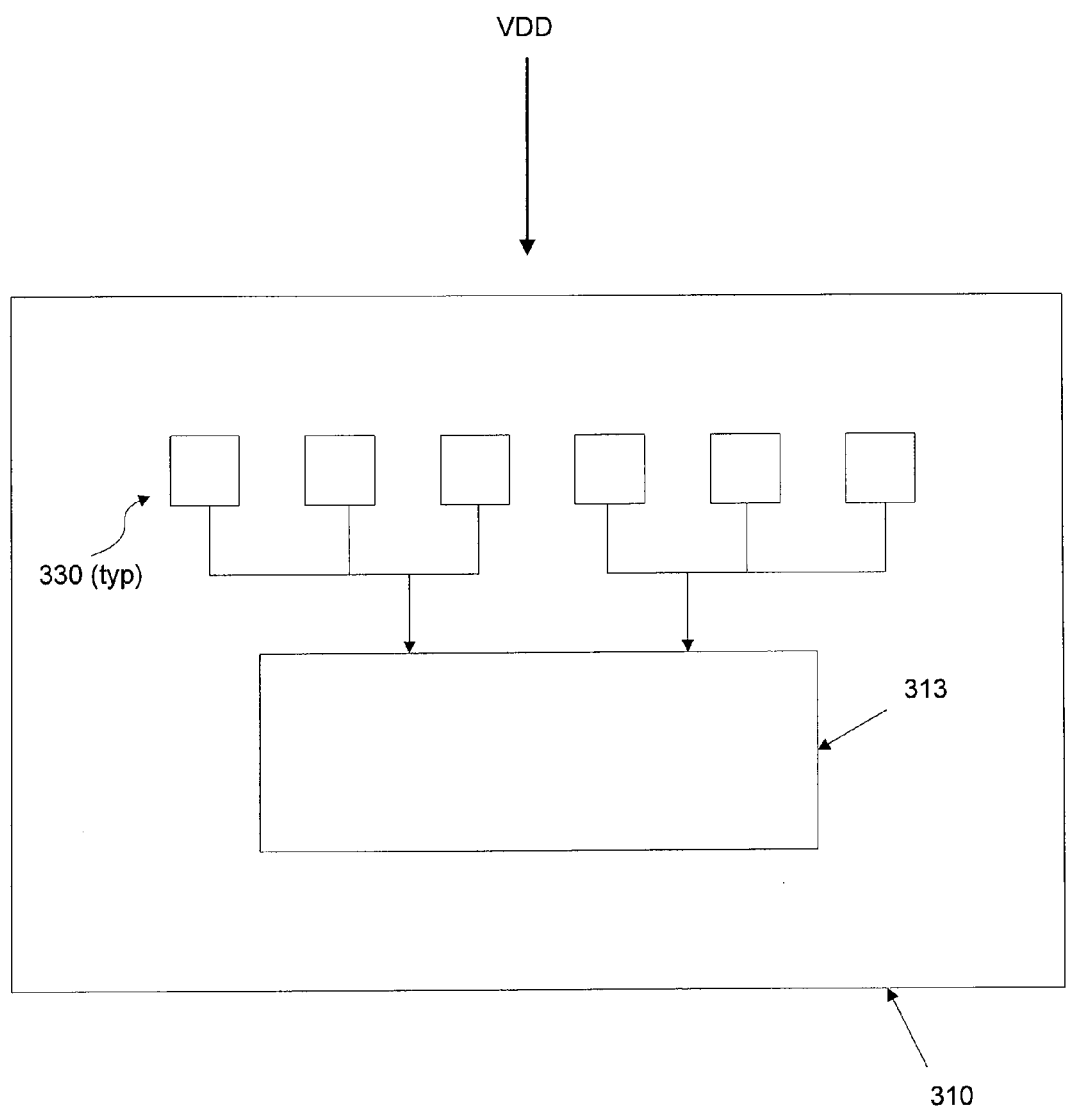
FIGS. 3A and 3B illustrate a block diagram of an exemplary embodiment of multi-chip Doherty amplifier.

In one exemplary embodiment and with reference to FIG. 3A, a MMIC 310 of a Doherty amplifier includes multiple contact pads 330 (bond pads). The contact pads 330 are the input point for the external bias voltage (VDD) being fed to MMIC 310. In an exemplary embodiment, different bond pads 330 are configured to provide different wire-bondable tap points within a voltage divider circuit. In an exemplary embodiment and as illustrated by FIG. 3A, bond pads 330 may be divided into two groups. A first group of bond pads 330 are designed for positive voltage biasing and a second group of bond pads 330 are designed for negative voltage biasing. The different bond pads 330 allow the proper detector bias to be achieved on chip. In accordance with an exemplary embodiment, multiple contact pads 330 on MMIC 310 allow for flexibility to adjust for process variation in the MMIC. In other words, multiple contact pads 330 may facilitate adjusting for manufacturing tolerances in MMIC 310. Furthermore, in an exemplary embodiment, the biasing of the power detectors is configured as a function of temperature for additional biasing control.

In another exemplary embodiment, multiple contact pads 330 provide a substantial difference in voltage biasing. For example, connecting 5 volts to a first contact pad may result in biasing a power detector at 0.5 volts. In contrast, connecting the same 5 volts to a second contact pad may result in biasing the power detector at less than 0.5 volts. In this exemplary embodiment, a common external power supply (VDD) supplies different biasing voltages to a power detector based on alternate contact pad connections and voltage division circuitry. In an exemplary negative voltage embodiment, a negative voltage is connected to a contact pad in order to bias a power detector at a negative voltage. In yet another exemplary embodiment, the sign of the bias voltage to the power detector is not limited to being the same sign as the supplied voltage. In other words, a positive VDD may be supplied to a contact pad and result in a negative bias voltage to the power detector. Similarly, a negative VDD may be supplied to a contact pad and result in a positive bias voltage to the power detector. Additionally, in an exemplary embodiment, the connection to a contact pad is made during assembly. In another exemplary embodiment, the connection to a contact pad is made after assembly in order to facilitate at least one of tuning and error adjustment.

Figure 3B:
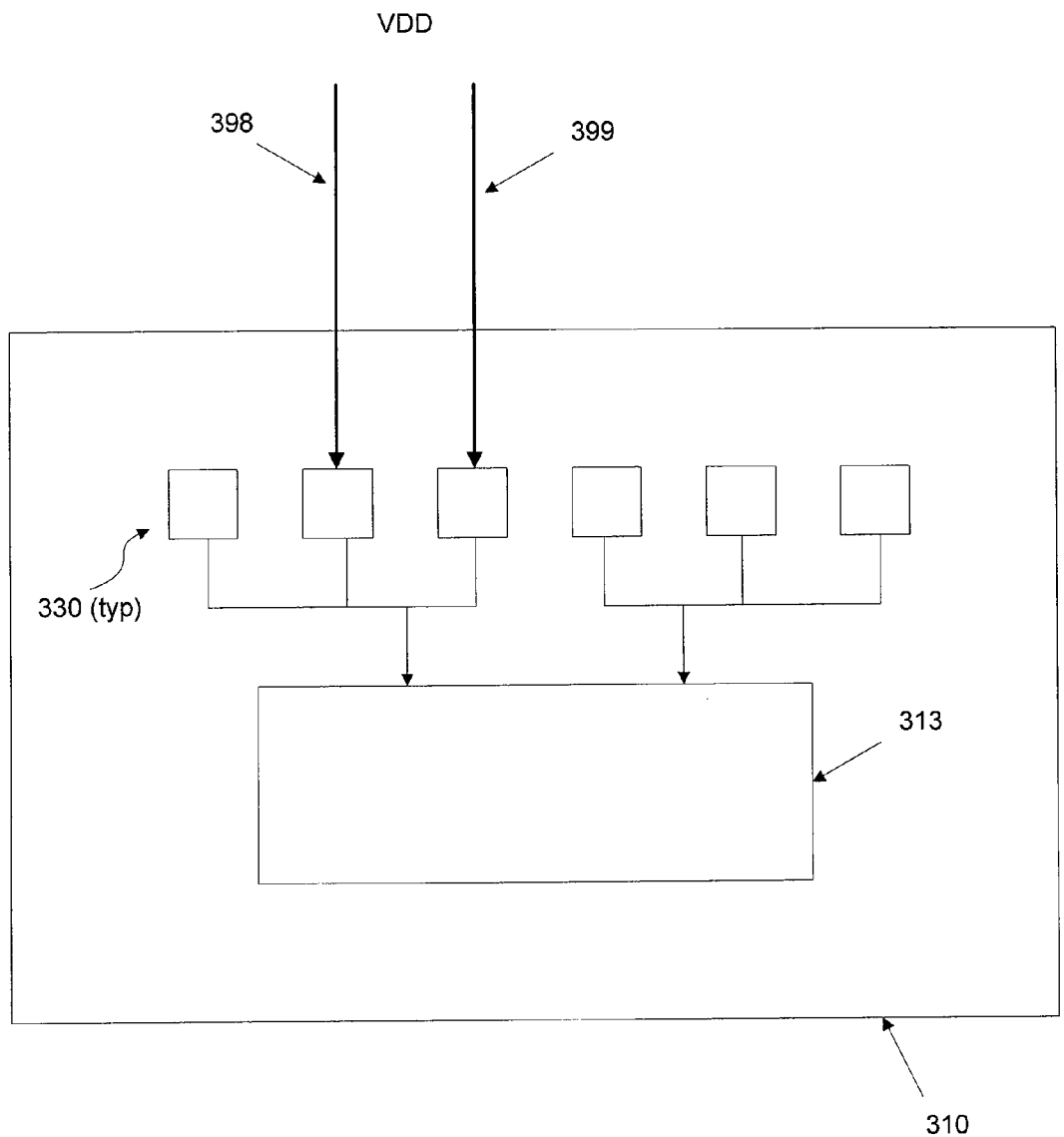

In accordance with an exemplary embodiment and with reference to FIG. 3B, MMIC 310 of a Doherty amplifier further comprises a first bias voltage connection 398 and a second bias voltage connection 399. The first and second bias voltage connections 398, 399 are connected to contact pads 330 and supply the external bias voltage (VDD) being fed to MMIC 310. In the exemplary embodiment, VDD is supplied through either first bias voltage connection 398 or second bias voltage connection 399. A switch may be used to change between the two connections. Supplying the external bias voltage to different contact pads 330 results in different biasing of the power detector.

In one embodiment, this switching may be used to adjust the operating of MMIC 310 of the Doherty amplifier. For example, switching between contact pads 330 facilitates error correction that may occur during operation. In another exemplary embodiment, more than two bias voltage connections may be present on MMIC 310, allowing for additional adjustment. Furthermore, in an exemplary embodiment, a switch used to change between the bias voltage connections operates at a switching rate that is at least 2 times faster than the modulation bandwidth of the Doherty Amplifier. A faster switching rate allows the change between first bias voltage connection 398 and second bias voltage connection 399 without missing a cycle of RF input.

Moreover, a Doherty amplifier with N amplifier paths is generally referred to as an N-way Doherty amplifier. In an exemplary embodiment and with reference to FIG. 4, a Doherty amplifier comprises multiple amplifier paths. In one embodiment, each path of an N-way Doherty amplifier is a separate MMIC. In an exemplary embodiment, each separate MMIC of the amplifier paths is the same, or substantially equivalent, MMIC type as the other MMICs of the N-way Doherty amplifier. An advantage of the implementing the same MMIC type in all amplifier paths is the increased convenience and cost effectiveness during manufacturing.

Figure 4:
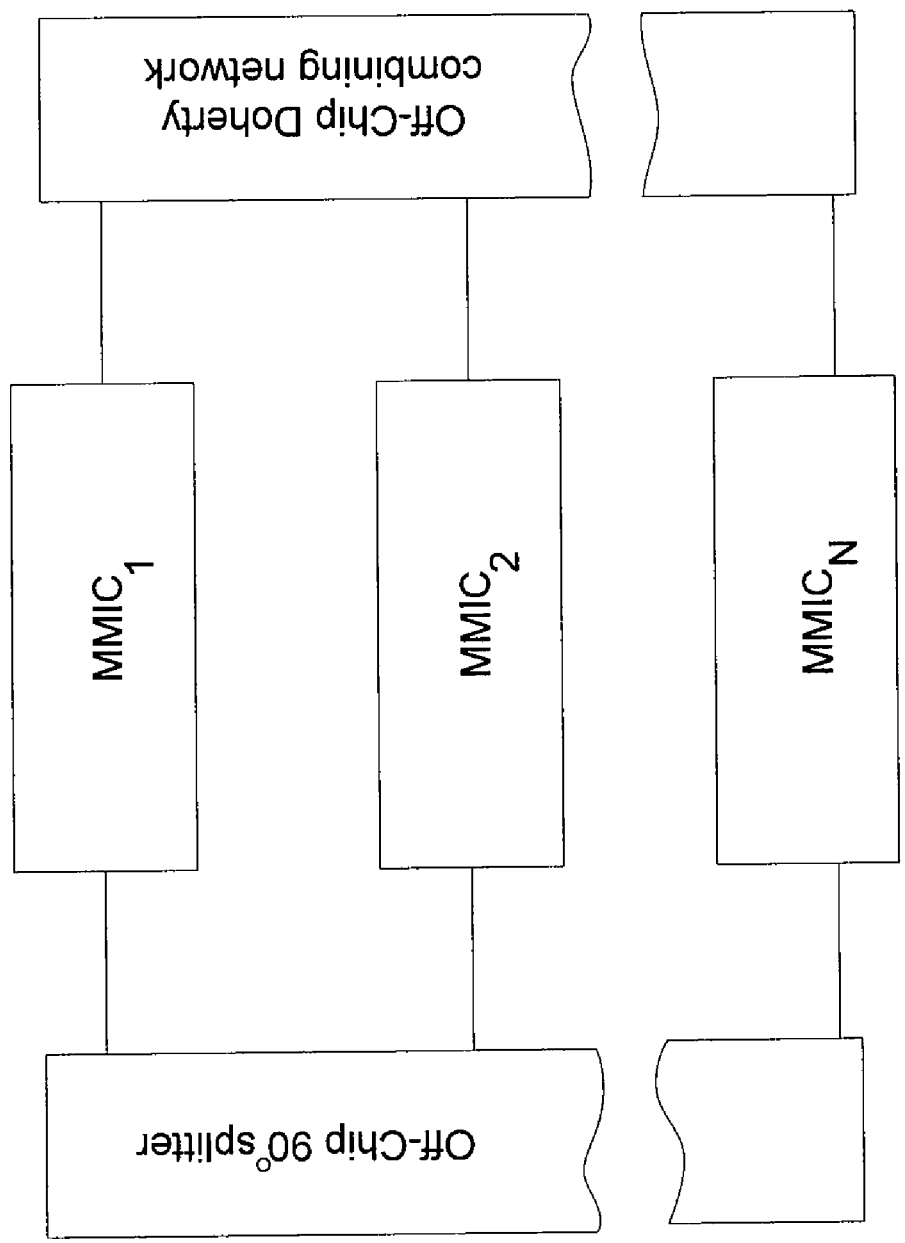
FIG. 4 is another block diagram of an exemplary embodiment of a multi-chip Doherty amplifier in accordance with an exemplary embodiment of the invention.

With continued reference to FIG. 4, in an exemplary embodiment, the N amplifier paths are biased differently. For example, the first MMIC may be biased as a carrier amplifier. The second MMIC may be biased as an initial peaking amplifier. The Nth MMIC may be biased as a higher level peaking amplifier. In other words, the Nth MMIC amplifies the signal in response to the signal exceeding the amplification level of the first and second MMICs.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. Exemplary embodiments of the invention have been disclosed in an illustrative style. Accordingly, the terminology employed throughout should be read in an exemplary rather than a limiting manner. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical." Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A Doherty amplifier comprising:
a first MMIC having a first power detector;
a second MMIC having a second power detector;
wherein the first MMIC and the second MMIC are structurally identical;
wherein the first MMIC is configured as a carrier amplifier and wherein the second MMIC is configured as a peaking amplifier; and
wherein the first power detector is negatively biased, and wherein the second power detector is positively biased;
wherein an amplifier control bias of the carrier amplifier is a function of the power detected by the first power detector and wherein an amplifier control bias of the peaking amplifier is a function of the power detected by the second power detector.

2. The Doherty amplifier of claim 1, wherein the first MMIC and the second MMIC individually comprise multiple contact pads, and wherein the multiple contact pads facilitate providing different bias voltage levels to the first MMIC and the second MMIC respectively.

3. The Doherty amplifier of claim 1, wherein the carrier amplifier provides a substantially constant amplification of a signal.

4. The Doherty amplifier of claim 1, wherein the peaking amplifier provides amplification of a signal based on RF input power.

5. The Doherty amplifier of claim 1, wherein at least one of the first power detector and the second power detector are biased as a function of respective power detector temperature.

6. The Doherty amplifier of claim 1,
wherein the first power detector is biased at a first bias level;
wherein the second power detector is biased at a second bias level, and wherein the first and second bias levels are different from each other.

7. The Doherty amplifier of claim 6, wherein the first bias level and the second bias level are such that the different bias levels give the first and second power detectors different sensitivity to a common RF input signal.

8. A Doherty amplifier comprising:
a first MMIC having a first integrated power detector;
a second MMIC having a second integrated power detector;
wherein the first MMIC and the second MMIC are substantially equivalent;
wherein the first integrated power detector is negatively biased, and wherein the second integrated power detector is positively biased; and
wherein amplifier control bias in each respective MMIC is a function of the power detected by the first and second integrated power detectors.

9. The Doherty amplifier of claim 8, wherein the first MMIC operates as a carrier amplifier and wherein the second MMIC operates as a peaking amplifier.

10. A multichip Doherty amplifier comprising:
a first MMIC chip and a second MMIC chip, individually comprising at least one amplifier, a power detector, and a bias circuit;
wherein input voltage to the power detector of the first MMIC chip is different than input voltage to the power detector of the second MMIC chip; and
wherein the power detector of the first MMIC chip provides a different bias current to the bias circuit based on a common RF signal in comparison to the power detector of the second MMIC chip, and wherein the first MMIC chip is forward-biased with a positive voltage.

11. The multichip Doherty amplifier of claim 10, wherein the power detector of the second MMIC chip is reverse-biased with a negative input voltage.

12. The multichip Doherty amplifier of claim 10, wherein each of multiple contact pads of a voltage divider circuit is configured to provide a different input voltage to the respective power detector of the first and second MMIC chips in response to receiving a common supply voltage.

13. The multichip Doherty amplifier of claim 10, further comprising an amplifier gate bias controller of the first MMIC chip and an amplifier gate bias controller of the second MMIC chip, wherein the amplifier gate bias controllers react similarly to similar input from the power detectors.

14. A method of controlling an N-way multichip Doherty amplifier with N physically identical separate parallel amplifier paths, each comprising an amplifier MMIC, a splitter connected to each MMIC and an RF power detector, the method comprising:
  detecting, with a first RF power detector, the power in an RF input signal in a first amplifier path of a first amplifier MMIC;
  providing a signal, representing the detected power, to an amplifier MMIC gate bias control of the first amplifier MMIC;
  biasing the first amplifier MMIC based on at least the detected power provided to the amplifier MMIC gate bias control;
  detecting, with a second RF power detector, the power in the RF input signal in a second amplifier path of a second amplifier MMIC;
  providing a signal, representing the detected power, to an amplifier MMIC gate bias control of the second amplifier MMIC; and
  biasing the second amplifier MMIC based on at least the detected power provided to the amplifier MMIC gate bias control.

15. The method of claim 14, wherein the first amplifier MMIC biasing is different than the second amplifier MMIC biasing.

16. The method of claim 14, further comprising:
  adaptively biasing power detectors on identical MMIC amplifiers that are in parallel to form an N-way Doherty amplifier, wherein the adaptive biasing is achieved by biasing the power detectors at different voltages; and
  generating a desired bias vs. RF power function, at a bias control circuit, for each amplifier path.

17. The method of claim 14, further comprising:
  providing a supply voltage to the first RF power detector; and
  providing a supply voltage to the second RF power detector;
  wherein the first RF power detector supply voltage is different than the second RF power detector supply voltage.

18. The method of claim 14, wherein the first amplifier MMIC is a carrier amplifier and the second amplifier MMIC is a peaking amplifier.

19. A Doherty amplifier comprising:
  a first MMIC having a first power detector;
  a second MMIC having a second power detector;
  wherein the first MMIC and the second MMIC are structurally identical;
  wherein the first MMIC is configured as a carrier amplifier and wherein the second MMIC is configured as a peaking amplifier; and
  wherein the first MMIC and the second MMIC individually comprise multiple contact pads, and wherein the multiple contact pads facilitate providing different bias voltage levels to the first MMIC and the second MMIC respectively;
  wherein an amplifier control bias of the carrier amplifier is a function of the power detected by the first power detector and wherein an amplifier control bias of the peaking amplifier is a function of the power detected by the second power detector.

20. A multichip Doherty amplifier comprising:
  a first MMIC chip and a second MMIC chip, individually comprising at least one amplifier, a power detector, and a bias circuit;
  wherein input voltage to the power detector is different between the first and second power detectors; and
  wherein the power detector of the first MMIC provides a different bias current to the bias circuit based on a common RF signal in comparison to the power detector of the second MMIC, and wherein the power detector of the second MMIC chip is reverse-biased with a negative input voltage.

* * * * *